United States Patent
Claassen (10) Patent No.: US 11,567,412 B2
(45) Date of Patent: Jan. 31, 2023

(54) SINGLE CURRENT SOURCE WITH LOCAL FINE TUNING FOR MULTI BEAM LASER IMAGING MODULE IN A LITHOGRAPHY PRINTING SYSTEM

(71) Applicant: Xerox Corporation, Norwalk, CT (US)

(72) Inventor: Franciscus Gerardus Johannes Claassen, Oploo (NL)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 17/345,643

(22) Filed: Jun. 11, 2021

(65) Prior Publication Data

US 2022/0397831 A1  Dec. 15, 2022

(51) Int. Cl.
*G03F 7/20* (2006.01)

(52) U.S. Cl.
CPC ...... *G03F 7/70483* (2013.01); *G03F 7/70025* (2013.01)

(58) Field of Classification Search
CPC .......... G03F 7/70483; G03F 7/70025
See application file for complete search history.

(56) References Cited

U.S. PATENT DOCUMENTS

| 7,039,082 B2 | 5/2006 | Stewart et al. |
| 7,991,281 B1* | 8/2011 | Majewicz ............... H05B 45/14 355/68 |
| 2003/0025972 A1 | 2/2003 | During et al. |
| 2012/0103212 A1 | 5/2012 | Stowe et al. |
| 2012/0103221 A1 | 5/2012 | Stowe et al. |
| 2017/0357174 A1* | 12/2017 | Seki ................. G03G 15/0266 |
| 2018/0111366 A1 | 4/2018 | Adiletta et al. |

FOREIGN PATENT DOCUMENTS

CN  2800337 Y  7/2006

OTHER PUBLICATIONS

Co-pending U.S. Appl. No. 17/137,473, filed Dec. 30, 2020.
Co-pending U.S. Appl. No. 16/916,907, filed Jun. 30, 2020.
Do-ending U.S. Appl. No. 16/917,044, filed Jun. 30, 2020.
Co-pending U.S. Appl. No. 17/137,516, filed Dec. 30, 2020.
Co-pending U.S. Appl. No. 16/913,302, filed Jun. 26, 2020.
Co-pending U.S. Appl. No. 17/137,711, filed Dec. 30, 2020.
Co-pending U.S. Appl. No. 16/913,351, filed Jun. 26, 2020.
Co-pending U.S. Appl. No. 17/137,626, filed Dec. 30, 2020.
Co-pending U.S. Appl. No. 16/913,626, filed Jun. 26, 2020.
Co-pending U.S. Appl. No. 17/149,161, filed Jan. 14, 2021.
Co-pending U.S. Appl. No. 17/161,879, filed Jan. 29, 2021.
Co-pending U.S. Appl. No. 17/177,262, filed Feb. 17, 2021.
Co-pending U.S. Appl. No. 17/336,729, filed Jun. 2, 2021.
English Abstract of CN2800337Y.

* cited by examiner

*Primary Examiner* — Mesfin T Asfaw
(74) *Attorney, Agent, or Firm* — Caesar Rivise, PC (57) ABSTRACT

According to aspects of the embodiments, there is provided an apparatus and method for driving a laser imaging module (LIM) that includes an adjustment current to have all laser diodes emitting the same amount of output so that the diodes can be connected in series on a single high current power source. Fine tuning can be done by a dedicated low current controllable power source connected directly to each laser diode. A series connected LIM uses only two heavy gauge wires so total power loss and heat stress on the LIM and module drawer connectors will be significantly reduced. Additional fine tuning can include an electronic gate so that individual diodes could be quickly turned off independently from each other.

20 Claims, 6 Drawing Sheets

Related Art

SINGLE CURRENT SOURCE WITH LOCAL FINE TUNING FOR MULTI BEAM LASER IMAGING MODULE IN A LITHOGRAPHY PRINTING SYSTEM

FIELD OF DISCLOSURE

This invention relates generally to digital printing systems, and more particularly, to a method and apparatus for variably marking or printing data to reduce heat dissipation and power consumption.

BACKGROUND

Conventional lithographic printing techniques cannot accommodate true high speed variable data printing processes in which images to be printed change from impression to impression, for example, as enabled by digital printing systems. The lithography process is often relied upon, however, because it provides very high quality printing due to the quality and color gamut of the inks used. Lithographic inks are also less expensive than other inks, toners, and many other types of printing or marking materials.

Ink-based digital printing uses a variable data lithography printing system, or digital offset printing system, or a digital advanced lithography imaging system. A "variable data lithography system" is a system that is configured for lithographic printing using lithographic inks and based on digital image data, which may be variable from one image to the next. "Variable data lithography printing," or "digital ink-based printing," or "digital offset printing," or digital advanced lithography imaging is lithographic printing of variable image data for producing images on a substrate that are changeable with each subsequent rendering of an image on the substrate in an image forming process.

For example, a digital offset printing process may include transferring ink onto a portion of an imaging member (e.g., fluorosilicone-containing imaging member, imaging blanket, printing plate) that has been selectively coated with a fountain solution (e.g., dampening fluid) layer according to variable image data. According to a lithographic technique, referred to as variable data lithography, a non-patterned reimageable surface of the imaging member is initially uniformly coated with the fountain solution layer. An imaging system then evaporates regions of the fountain solution layer in an image area by exposure to a focused radiation source (e.g., a laser light source, high power laser) to form pockets. A temporary pattern latent image in the fountain solution is thereby formed on the surface of the digital offset imaging member. The latent image corresponds to a pattern of the applied fountain solution that is left over after evaporation. Ink applied thereover is retained in the pockets where the laser has vaporized the fountain solution. Conversely, ink is rejected by the plate regions where fountain solution remains. The inked surface is then brought into contact with a substrate at a transfer nip and the ink transfers from the pockets in the fountain solution layer to the substrate. The fountain solution may then be removed, a new uniform layer of fountain solution applied to the printing plate, and the process repeated.

The formation of the image on the printing plate is done with imaging modules each using a linear output high power infrared (IR) laser to illuminate a digital light projector (DLP) multi-mirror array, also referred to as the "DMD" (Digital Micromirror Device). The mirror array is similar to what is commonly used in computer projectors and some televisions. The laser provides constant illumination to the mirror array. The mirror array deflects individual mirrors to form the pixels on the image plane to pixel-wise evaporate the fountain solution on the silicone plate. If a pixel is not to be turned on, the mirrors for that pixel deflect such that the laser illumination for that pixel does not hit the silicone surface, but goes into a chilled light dump heat sink. A single laser and mirror array form an imaging module that provides imaging capability for approximately one (1) inch in the cross-process direction. Thus a single imaging module simultaneously images a one (1) inch by one (1) pixel line of the image for a given scan line. At the next scan line, the imaging module images the next one (1) inch by one (1) pixel line segment. By using several imaging modules, comprising several lasers and several mirror-arrays, butted together, imaging function for a very wide cross-process width is achieved.

Due to the need to evaporate the fountain solution, in the imaging module, power consumption of the laser accounts for the majority of total power consumption, which correlates with heat generation, of the whole system. It is therefore vital to scheme how much electric power of the laser and the electronics is saved in terms of realizing power saving of the whole system. Such being the case, a variety of power saving technologies for the imaging modules have been proposed.

An over looked area of power consumption and heat generation is the operation of the lasers in the digital lithographic printing process. As the conventional module has 15 laser diodes 30 heavy gauge cables carrying 150 A each are required to power this module. Although heavy copper wires are used a lot of heat is generated by these wires. This results in poor efficiency and significant energy loss. Another problem is caused by the connectors which are needed to connect the laser module to the main system. Due to the high current a lot of heat is concentrated in these connector modules which significantly impact their reliability and life expectancy.

It would therefore be a significant advance in the art of digital offset printing if the amount of heat and or power consumption which is used in the marking process could be reduced without disrupting the operation of the printing process.

SUMMARY

The following presents a simplified summary in order to provide a basic understanding of some aspects of one or more embodiments or examples of the present teachings. This summary is not an extensive overview, nor is it intended to identify key or critical elements of the present teachings, nor to delineate the scope of the disclosure. Rather, its primary purpose is merely to present one or more concepts in simplified form as a prelude to the detailed description presented later. Additional goals and advantages will become more evident in the description of the figures, the detailed description of the disclosure, and the claims.

The foregoing and/or other aspects and utilities embodied in the present disclosure may be achieved by providing an adjustment current at each radiation source of the imaging module that is powered by a single high current power source.

The disclosure provides a driving device. The driving device is coupled to a laser imaging module ("LIM") comprising different numbers of laser diodes organized in an array. Each laser diode in the array may require a predetermined current pulse having a current amplitude and shape as a function of time. The driving device includes a first current source and a dedicated low current controllable power source (second current) at a selected number of laser diodes. The first current source provides a base current to drive the LIM. The second current source generates an adjustment current according to a reference current/voltage and enables the adjustment current to adjust magnitude of the first current flowing through the laser diode. The proposed fine tuning can be done by a dedicated low current controllable power source connected directly to the laser diode locally. This means that only two heavy gauge wires are needed and heat dissipation along with power consumption is reduced.

According to aspects illustrated herein, an exemplary apparatus to drive a multi beam laser imaging module in a variable data lithographic system comprising a laser imaging module comprising a series-connected laser-diode array, wherein each laser-diode has a first terminal and a second terminal; a first current source to drive the laser imaging module with a first current that flows sequentially through each of the laser-diode of the laser-diode array; and at least one adjustment current apparatus, for producing an adjustment current to the first current flowing into a first terminal of a laser-diode in accordance to a reference level; wherein an adjustment current apparatus is parallel connected to a laser-diode to supply the adjustment current.

According to aspects described herein, a method useful for controlling a driving circuit to drive a multi beam laser imaging module in a variable data lithographic system comprising using a laser imaging module comprising a series-connected laser-diode array, wherein each laser-diode has a first terminal and a second terminal; using a first current source to drive the laser imaging module with a first current that flows sequentially through each of the laser-diode of the laser-diode array; and using at least one adjustment current apparatus, for producing an adjustment current to the first current flowing into a first terminal of a laser-diode in accordance to a reference level; wherein an adjustment current apparatus is parallel connected to a laser-diode to supply the adjustment current.

Exemplary embodiments are described herein. It is envisioned, however, that any system that incorporates features of apparatus and systems described herein are encompassed by the scope and spirit of the exemplary embodiments.

BRIEF DESCRIPTION OF THE DRAWINGS

Various exemplary embodiments of the disclosed apparatuses, mechanisms and methods will be described, in detail, with reference to the following drawings, in which like referenced numerals designate similar or identical elements, and.

DETAILED DESCRIPTION

Illustrative examples of the devices, systems, and methods disclosed herein are provided below. An embodiment of the devices, systems, and methods may include any one or more, and any combination of, the examples described below. This invention may, however, be embodied in many different forms and should not be construed as limited to the embodiments set forth below. Rather, these exemplary embodiments are provided so that this disclosure will be thorough and complete, and will fully convey the scope of the invention to those skilled in the art. Accordingly, the exemplary embodiments are intended to cover all alternatives, modifications, and equivalents as may be included within the spirit and scope of the apparatuses, mechanisms and methods as described herein.

We initially point out that description of well-known starting materials, processing techniques, components, equipment and other well-known details may merely be summarized or are omitted so as not to unnecessarily obscure the details of the present disclosure. Thus, where details are otherwise well known, we leave it to the application of the present disclosure to suggest or dictate choices relating to those details. The drawings depict various examples related to embodiments of illustrative methods, apparatus, and systems for inking from an inking member to the reimageable surface of a digital imaging member.

When referring to any numerical range of values herein, such ranges are understood to include each and every number and/or fraction between the stated range minimum and maximum. For example, a range of 0.5-6% would expressly include the endpoints 0.5% and 6%, plus all intermediate values of 0.6%, 0.7%, and 0.9%, all the way up to and including 5.95%, 5.97%, and 5.99%. The same applies to each other numerical property and/or elemental range set forth herein, unless the context clearly dictates otherwise.

The modifier "about" used in connection with a quantity is inclusive of the stated value and has the meaning dictated by the context (for example, it includes at least the degree of error associated with the measurement of the particular quantity). When used with a specific value, it should also be considered as disclosing that value. For example, the term "about 2" also discloses the value "2" and the range "from about 2 to about 4" also discloses the range "from 2 to 4."

The term "controller" is used herein generally to describe various apparatus such as a computing device relating to the operation of one or more device that directs or regulates a process or machine. A controller can be implemented in numerous ways (e.g., such as with dedicated hardware) to perform various functions discussed herein. A "processor" is one example of a controller which employs one or more microprocessors that may be programmed using software (e.g., microcode) to perform various functions discussed herein. A controller may be implemented with or without employing a processor, and also may be implemented as a combination of dedicated hardware to perform some functions and a processor (e.g., one or more programmed microprocessors and associated circuitry) to perform other functions. Examples of controller components that may be employed in various embodiments of the present disclosure include, but are not limited to, conventional microprocessors, application specific integrated circuits (ASICs), and field-programmable gate arrays (FPGAs).

The terms "media", "print media", "print substrate" and "print sheet" generally refers to a usually flexible physical sheet of paper, polymer, Mylar material, plastic, or other suitable physical print media substrate, sheets, webs, etc., for images, whether precut or web fed. The listed terms "media", "print media", "print substrate" and "print sheet" may also include woven fabrics, non-woven fabrics, metal films, and foils, as readily understood by a skilled artisan.

The term "image forming device", "printing device" or "printing system" as used herein may refer to a digital copier or printer, scanner, image printing machine, xerographic device, electrostatographic device, digital production press, document processing system, image reproduction machine, bookmaking machine, facsimile machine, multi-function machine, or generally an apparatus useful in performing a print process or the like and can include several marking engines, feed mechanism, scanning assembly as well as other print media processing units, such as paper feeders, finishers, and the like. A "printing system" may handle sheets, webs, substrates, and the like. A printing system can place marks on any surface, and the like, and is any machine that reads marks on input sheets; or any combination of such machines.

Inking systems or devices may be incorporated into a digital offset image forming device architecture so that the inking system is arranged about a central imaging plate, also referred to as an imaging member. In such a system, the imaging member, including a central drum or cylinder is provided with a reimageable layer. This blanket layer has specific properties such as composition, surface profile, and so on so as to be well suited for receipt and carrying a layer of a fountain solution. A surface of the imaging member is reimageable making the imaging member a digital imaging member. The surface is constructed of elastomeric materials and conformable. A paper path architecture may be situated adjacent the imaging member to form a media transfer nip.

A layer of fountain solution may be applied to the surface of the imaging member by a dampening system. In a digital evaporation step, particular portions of the fountain solution layer applied to the surface of the imaging member may be evaporated by a digital evaporation system. For example, portions of the fountain solution layer may be vaporized by an optical patterning subsystem such as a scanned, modulated laser that patterns the fluid solution layer to form a latent image. In a vapor removal step, the vaporized fountain solution may be collected by a vapor removal device or vacuum to prevent condensation of the vaporized fountain solution back onto the imaging plate.

In an inking step, ink may be transferred from an inking system to the surface of the imaging member such that the ink selectively resides in evaporated voids formed by the patterning subsystem in the fountain solution layer to form an inked image. In an image transfer step, the inked image is then transferred to a print substrate such as paper via pressure at the media transfer nip.

In a variable lithographic printing process, previously imaged ink must be removed from the imaging member surface to prevent ghosting. After an image transfer step, the surface of the imaging member may be cleaned by a cleaning system so that the printing process may be repeated. For example, tacky cleaning rollers may be used to remove residual ink and fountain solution from the surface of the imaging member. The inking, transferring, and cleaning process causes the properties of the imaging member or imaging blanket to undergo wear and tear causing changes through the life of the blanket. Property changes of the blanket create a huge variability that makes thin film thickness measurement a difficult or daunting task.

Figure 1:
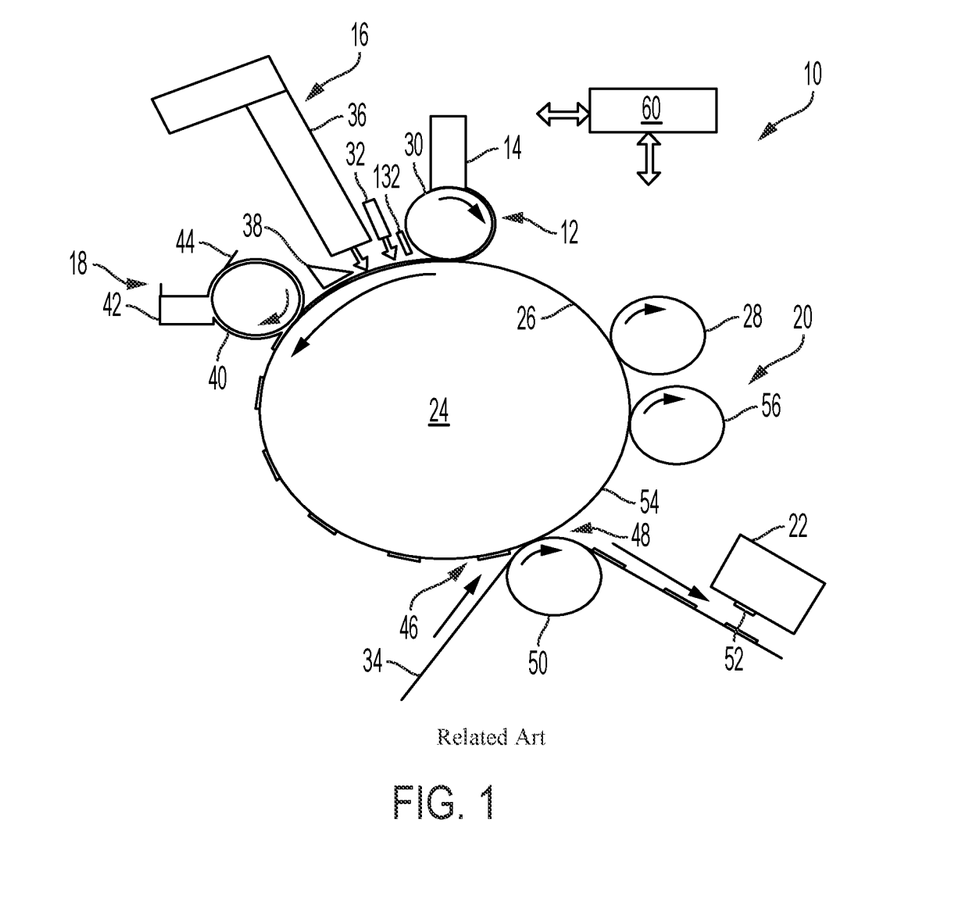
FIG. 1 is block diagram of a digital image forming device in accordance with examples of the embodiments.

FIG. 1 depicts an exemplary ink-based digital image forming device 10. The image forming device 10 may include dampening station 12 having fountain solution applicator 14, optical patterning subsystem 16, inking apparatus 18, and a cleaning device 20. The image forming device 10 may also include one or more rheological conditioning subsystems 22 as discussed, for example, in greater detail below. FIG. 1 shows the fountain solution applicator 14 arranged with a digital imaging member 24 having a reimageable surface 26. While FIG. 1 shows components that are formed as rollers, other suitable forms and shapes may be implemented.

The imaging member surface 26 may be wear resistant and flexible. The surface 26 may be reimageable and conformable, having an elasticity and durometer, and sufficient flexibility for coating ink over a variety of different media types having different levels of roughness. A thickness of the reimageable surface layer may be, for example, about 0.5 millimeters to about 4 millimeters. The surface 26 should have a weak adhesion force to ink, yet good oleophilic wetting properties with the ink for promoting uniform inking of the reimageable surface and subsequent transfer lift of the ink onto a print substrate.

The soft, conformable surface 26 of the imaging member 24 may include, for example, hydrophobic polymers such as silicones, partially or fully fluorinated fluorosilicones and FKM fluoroelastomers. Other materials may be employed, including blends of polyurethanes, fluorocarbons, polymer catalysts, platinum catalyst, hydrosilyation catalyst, etc. The surface may be configured to conform to a print substrate on which an ink image is printed. To provide effective wetting of fountain solutions such as water-based dampening fluid, the silicone surface need not be hydrophilic, but may be hydrophobic. Wetting surfactants, such as silicone glycol copolymers, may be added to the fountain solution to allow the fountain solution to wet the reimageable surface 26. The imaging member 24 may include conformable reimageable surface 26 of a blanket or belt wrapped around a roll or drum. The imaging member surface 26 may be temperature controlled to aid in a printing operation. For example, the imaging member 24 may be cooled internally (e.g., with chilled fluid) or externally (e.g., via a blanket chiller roll 28 to a temperature (e.g., about 10° C.-60° C.) that may aid in the image forming, transfer and cleaning operations of image forming device 10.

The reimageable surface 26 or any of the underlying layers of the reimageable belt/blanket may incorporate a radiation sensitive filler material that can absorb laser energy or other highly directed energy in an efficient manner. Examples of suitable radiation sensitive materials are, for example, microscopic (e.g., average particle size less than 10 micrometers) to nanometer sized (e.g., average particle size less than 1000 nanometers) carbon black particles, carbon black in the form of nano particles of, single or multi-wall nanotubes, graphene, iron oxide nano particles, nickel plated nano particles, etc., added to the polymer in at least the near-surface region. It is also possible that no filler material is needed if the wavelength of a laser is chosen so to match an absorption peak of the molecules contained within the fountain solution or the molecular chemistry of the outer surface layer. As an example, a 2.94 μm wavelength laser would be readily absorbed due to the intrinsic absorption peak of water molecules at this wavelength.

The fountain solution applicator 14 may be configured to deposit a layer of fountain solution onto the imaging member surface 26 directly or via an intermediate member (e.g., roller 30) of the dampening station 12. While not being limited to particular configuration, the fountain solution applicator 14 may include a series of rollers or sprays (not shown) for uniformly wetting the reimageable surface 26 with a uniform layer of fountain solution with the thickness of the layer being controlled. The series of rollers may be considered as dampening rollers or a dampening unit, for uniformly wetting the reimageable surface 26 with a layer of fountain solution. The fountain solution may be applied by fluid or vapor deposition to create a thin layer (e.g., between about 0.01 µm and about 1.0 µm in thickness, less than 5 µm, about 50 nm to 100 nm) of the fountain solution for uniform wetting and pinning.

A sensor 32, for example an in-situ non-contact laser gloss sensor or laser contrast sensor, may be used to confirm the uniformity of the layer. Such a sensor can be used to automate the dampening station 12. While not being limited to a particular utility, the sensor 32 may provide feedback to control the deposition of the fountain solution onto reimageable surface 26.

The optical patterning subsystem 16 is located downstream the fountain solution applicator 14 in the printing processing direction to selectively pattern a latent image in the layer of fountain solution by image-wise patterning using, for example, laser energy generally referred to as the Laser Imaging Module (LIM). Generally the LIM comprises an array of laser diodes each tuned to emit a range of laser energy. For example, the fountain solution layer is exposed to an energy source (e.g. a laser) that selectively applies energy to portions of the layer to image-wise evaporate the fountain solution and create a latent "negative" of the ink image that is desired to be printed on a receiving substrate 34. Image areas are created where ink is desired, and non-image areas are created where the fountain solution remains. While the optical patterning subsystem 16 is shown as including laser emitter (LIM) 36, it should be understood that a variety of different systems may be used to deliver the optical energy to pattern the fountain solution layer.

Still referring to FIG. 1, a vapor vacuum 38 or air knife may be positioned downstream the optical patterning subsystem to collect vaporized fountain solution and thus avoid leakage of excess fountain solution into the environment. Reclaiming excess vapor prevents fountain solution from depositing uncontrollably prior to the inking apparatus 18 and imaging member 24 interface. The vapor vacuum 38 may also prevent fountain solution vapor from entering the environment. Reclaimed fountain solution vapor can be condensed, filtered and reused as understood by a skilled artisan to help minimize the overall use of fountain solution by the image forming device 10.

Following patterning of the fountain solution layer by the optical patterning subsystem 16, the patterned layer over the reimageable surface 26 is presented to the inking apparatus 18. The inker apparatus 18 is positioned downstream the optical patterning subsystem 16 to apply a uniform layer of ink over the layer of fountain solution and the reimageable surface layer 26 of the imaging member 24. The inking apparatus 18 may deposit the ink to the evaporated pattern representing the imaged portions of the reimageable surface 26, while ink deposited on the unformatted portions of the fountain solution will not adhere based on a hydrophobic and/or oleophobic nature of those portions. The inking apparatus may heat the ink before it is applied to the surface 26 to lower the viscosity of the ink for better spreading into imaged portion pockets of the reimageable surface. For example, one or more rollers 40 of the inking apparatus 18 may be heated, as well understood by a skilled artisan. Inking roller 40 is understood to have a structure for depositing marking material onto the reimageable surface layer 26, and may include an anilox roller or an ink nozzle. Excess ink may be metered from the inking roller 40 back to an ink container 42 of the inker apparatus 18 via a metering member 44 (e.g., doctor blade, air knife).

Although the marking material may be an ink, such as a UV-curable ink, the disclosed embodiments are not intended to be limited to such a construct. The ink may be a UV-curable ink or another ink that hardens when exposed to UV radiation. The ink may be another ink having a cohesive bond that increases, for example, by increasing its viscosity. For example, the ink may be a solvent ink or aqueous ink that thickens when cooled and thins when heated.

Downstream the inking apparatus 18 in the printing process direction resides ink image transfer station 46 that transfers the ink image from the imaging member surface 26 to a print substrate 34. The transfer occurs as the substrate 34 is passed through a transfer nip 48 between the imaging member 24 and an impression roller 50 such that the ink within the imaged portion pockets of the reimageable surface 26 is brought into physical contact with the substrate 34.

Rheological conditioning subsystems 22 may be used to increase the viscosity of the ink at specific locations of the digital offset image forming device 10 as desired. While not being limited to a particular theory, rheological conditioning subsystem 22 may include a curing mechanism 52, such as a UV curing lamp (e.g., standard laser, UV laser, high powered UV LED light source), wavelength tunable photoinitiator, or other UV source, that exposes the ink to an amount of UV light (e.g., # of photons radiation) to at least partially cure the ink/coating to a tacky or solid state. The curing mechanism may include various forms of optical or photo curing, thermal curing, electron beam curing, drying, or chemical curing. In the exemplary image forming device 10 depicted in FIG. 1, rheological conditioning subsystem 22 may be positioned adjacent the substrate 34 downstream the ink image transfer station 46 to cure the ink image transferred to the substrate. Rheological conditioning subsystems 22 may also be positioned adjacent the imaging member surface 26 between the ink image transfer station 46 and cleaning device 20 as a preconditioner to harden any residual ink 54 for easier removal from the imaging member surface 26 that prepares the surface to repeat the digital image forming operation.

This residual ink removal is most preferably undertaken without scraping or wearing the imagable surface of the imaging member. Removal of such remaining fluid residue may be accomplished through use of some form of cleaning device 20 adjacent the surface 26 between the ink image transfer station 46 and the fountain solution applicator 14. Such a cleaning device 20 may include at least a first cleaning member 56 such as a sticky or tacky roller in physical contact with the imaging member surface 26, with the sticky or tacky roller removing residual fluid materials (e.g., ink, fountain solution) from the surface. The sticky or tacky roller may then be brought into contact with a smooth roller (not shown) to which the residual fluids may be transferred from the sticky or tacky member, the fluids being subsequently stripped from the smooth roller by, for example, a doctor blade or other like device and collected as waste. It is understood that the cleaning device 20 is one of numerous types of cleaning devices and that other cleaning devices designed to remove residual ink/fountain solution from the surface of imaging member 24 are considered within the scope of the embodiments. For example, the cleaning device could include at least one roller, brush, web, belt, tacky roller, buffing wheel, etc., as well understood by a skilled artisan.

In the image forming device 10, functions and utility provided by the dampening station 12, optical patterning subsystem 16, inking apparatus 18, cleaning device 20, rheological conditioning subsystems 22, imaging member 24 and sensor 32 may be controlled, at least in part by controller 60 components which are shown and described in FIG. 9 as controller 900. Such a controller 60 is shown in FIG. 1 and may be further designed to receive information and instructions from a workstation or other image input devices (e.g., computers, smart phones, laptops, tablets, kiosk) to coordinate the image formation on the print substrate through the various subsystems such as the dampening station 12, patterning subsystem 16, inking apparatus 18, imaging member 24 and sensor 32 as discussed in greater detail below and understood by a skilled artisan.

In describing the embodiment of the present invention the portions which are the same as those in a prior described embodiment are denoted by the same reference numerals, and descriptions of the same portions as those as in a prior embodiment will be omitted.

Figure 2:
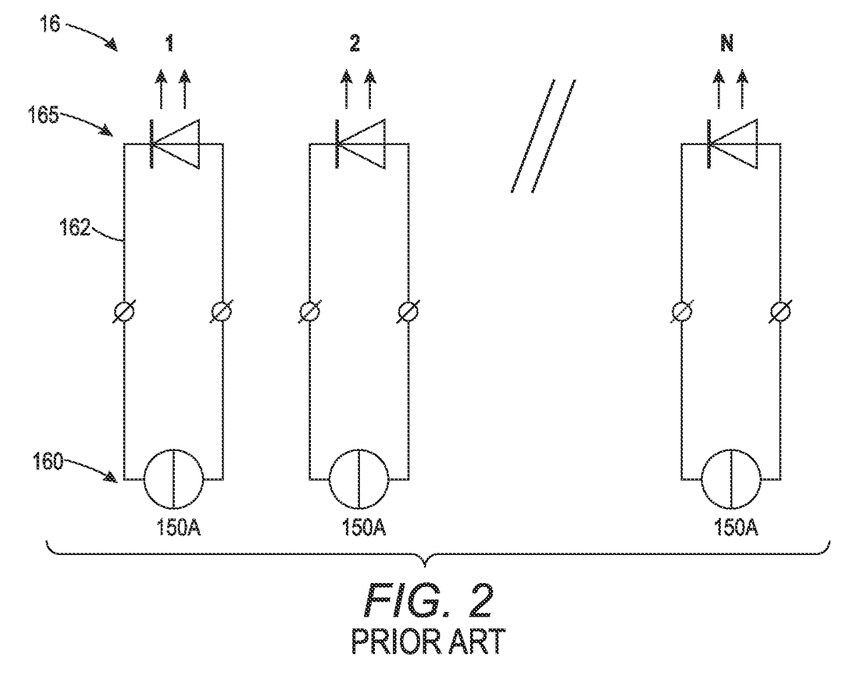
FIG. 2 shows a conventional current driving circuit an optical patterning subsystem like shown in FIG. 1.

FIG. 2 shows a conventional driving circuit an optical patterning subsystem like shown in FIG. 1. The illustrated prior art drive circuit requires a dedicated current source that increases the internal heat of the printing system. In the illustrated scenario each of the N laser diodes (LED) 165 of the LIM forming part of patterning circuit 16 is powered by its own current source 160. Although these current sources 160 are fully controllable they are all set at a similar set point during a print job application. As the LIM has N laser diodes 2N heavy gauge cables 162 carrying 150 Amps each are required to power this module. Although heavy copper wires are used a lot of heat is generated by these wires 162. In a digital lithography system even with the heavy gauge wire used a significant amount of voltage drop is present. Maximum operating voltage for the laser diode is around 1.6 volt but the power supply rating needs to be around 3.0V in order to compensate for the voltage drop. This means that almost half of the power is lost and turned into heat in the cables and connectors. This results in poor efficiency and significant energy loss through heat. Adding to the heat are two multi pole drawer connectors which are needed to connect the laser module to the main power system. Due to the high current a lot of heat is concentrated in these connector modules which is significantly impacting their reliability and life time of the internal components.

Figure 3:
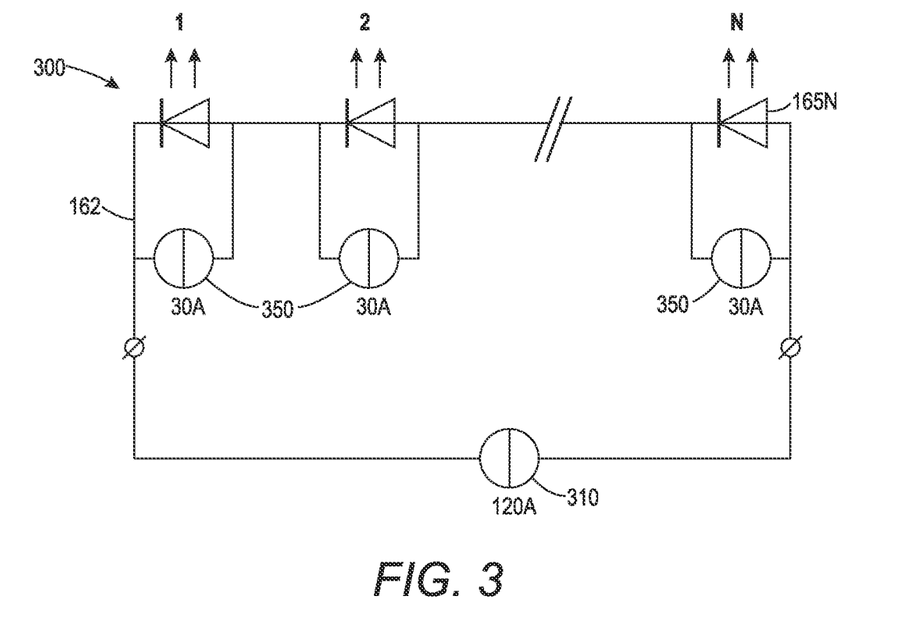
FIG. 3 is the proposed driving circuit comprising series connected light sources with adjustment current source in accordance to an embodiment.

FIG. 3 is the proposed driving circuit comprising series connected light sources with adjustment current source in accordance to an embodiment. The illustrated circuit comprises a series connected light emitting diodes (LEDs), a single current source 310 for providing a first current 315, and one or more adjustment current apparatuses like 350. The proposed driving circuit 300 serially connects the laser diodes (1 . . . N) 165 and at each laser diode like 165N an adjustable current apparatus 350 is provided to regulated the flowing first current 315 so as to maintain a desired optical intensity.

As there is only a relatively small amount of adjustment current 350 required to have all laser diodes emitting the same amount of output the lasers can be connected in series on a single high current power source 310. Fine tuning can be done by a dedicated low current controllable power source 350 connected directly to the laser diode locally. This means that only two heavy gauge wires are needed instead of N wires. Total power loss and heat stress on the module drawer connectors will be significantly reduced. The current-adjusting apparatus 350 outputs a driving current in response to the reference current/voltage that can be set based on a desired amount current at the first terminal (input) of the LED. In this way, the driving current output from the current-adjusting apparatus 350 is not fixed and luminance variations or differences due to changes in current flowing through the LED strings can be avoided.

Figure 4:
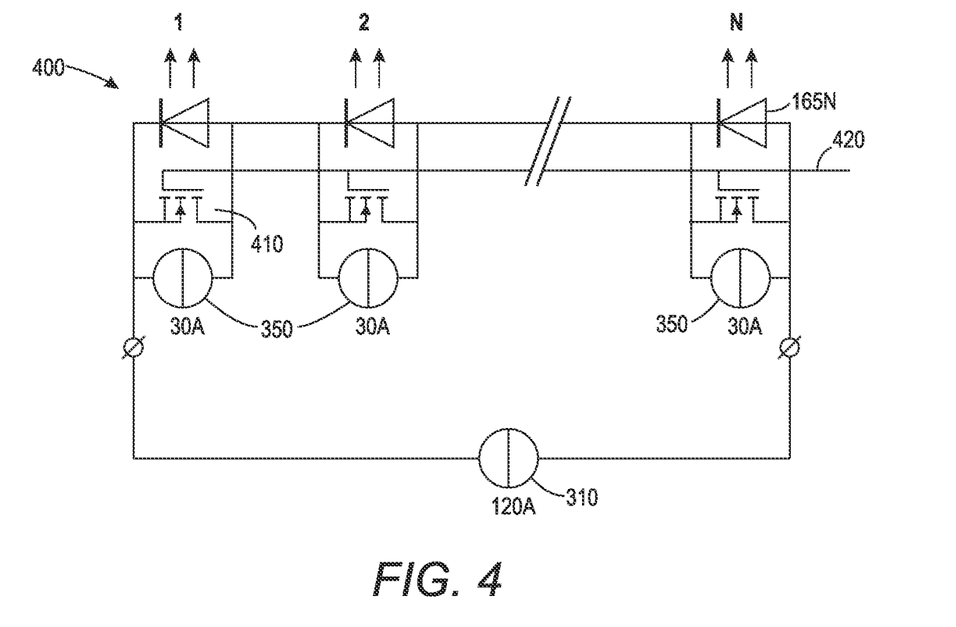
FIG. 4 is a proposed driving circuit comprising series connected light sources with adjustment current source and electric gate in accordance to an embodiment.

FIG. 4 is a proposed driving circuit comprising series connected light sources with adjustment current source and electric gate in accordance to an embodiment. The illustrated embodiment uses the same component described in FIG. 3 such as current source 310, adjustment current apparatus 350, and N light emitting diodes 165.

In current digital lithography printing a large percentage of the laser output energy from LIM 36 is dumped into a heatsink module (not shown). This is the case for all areas in the image area that do not require to be inked. In order to save energy and limit heat dissipation it would be very beneficial when lasers could be quickly turned off independently from each other by use of a switch (SO). SO can be implemented with low impedance Mosfets since they are readily available and because their max Vdss can be low heat dissipation is negligible. The illustrated drive circuit 400 allows for an electric gate or electronically switchable circuit like MOSFET 410 to bypass a selected LED and prevent activation just by adding a switchable short circuit parallel to each laser diode. Bypassing the diode prevents LED light activation and unnecessary heat can be greatly reduced. In some embodiments, a single switch SO (which can be one or more MOSFETs (e.g., wired in parallel if two or more) is provided to turn off current through the laser diodes 165 or other load. The electronically switchable circuit comprises an N channel MOSFET 410 alternately turning substantially on and substantially off and coupled to provide a switched current path for the first current 315 as controlled/activated by trigger signal 420 which can be, for example, a pulse train. Just a few semiconductor transistor devices should be sufficient to turn the laser diode off.

Figure 5:
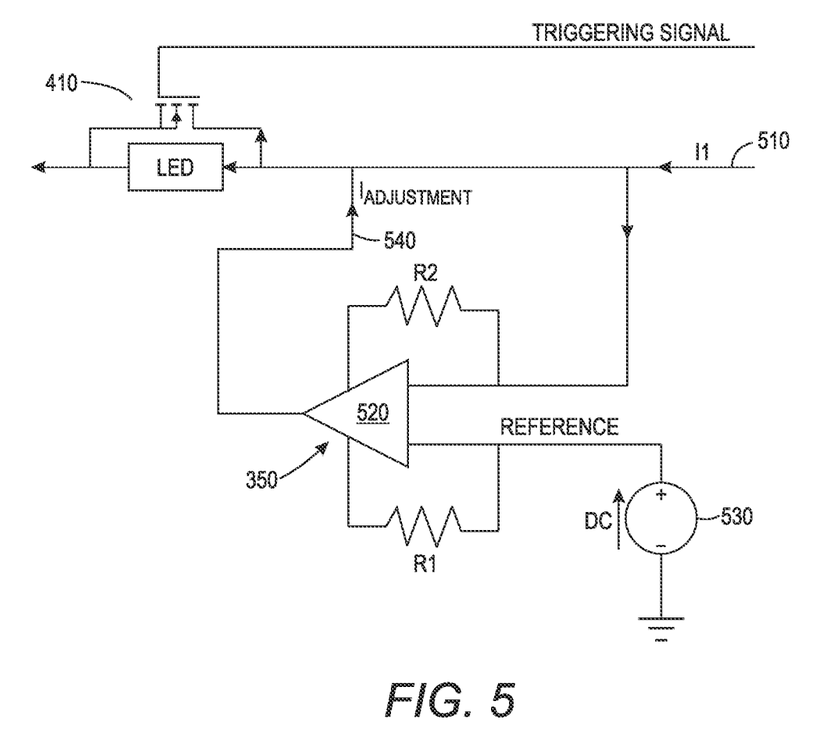
FIG. 5 is a block diagram of an adjustment current apparatus and electric gate for bypassing a light emitting source in accordance to an embodiment.

FIG. 5 is a block diagram of an adjustment current apparatus and electric gate for bypassing a light emitting source in accordance to an embodiment. Apparatus 500 illustrates possible components that can be used at each LED of LIM 36 to maintain or bypass the illumination of the laser component (LED) at a desired level. At this level there are two primary functions such as bypassing or adjusting the first current 510. The bypassing was described in FIG. 4 with reference to MOSFET 410 and triggering signal 550. The current adjustment 350 aspects of the embodiments can be implemented with the use of a comparator 520.

The comparator 520 has two inputs constituted of the first current 510 and a reference current 530 that may be set at a specific value to insure a desired illumination level at LED 165. The comparator 520 outputs a comparative current 540 which in the illustration is the current adjustment for the LED, which is obtained by comparing a first current 510 input to the reference current 530. That is, the comparator 520 outputs a higher current when a current input (510) is lower than the reference current 530. The comparator 520 outputs a lower current (for example, 0 A) when a current input 510 is higher than a reference current 530 that conforms to a desired illumination level. The comparator 520 outputs any intermediate current between the higher current (additive) and the low current (like 0 Amps) based on the input current 510 and the desired/selected reference current that corresponds to the illumination level of LED 165. An example configuration for comparator 520 can comprise an operational amplifier (differential amplifier) with divider resistors (R1 & R2). The threshold current 530 applied to the comparator 520 is a constant current and is set to a value of expected input current or smaller than an average input current of the LED like 165 in normal operation. Since the comparator 520 compares two current values to each other, it is also referred to as a current comparator. It is to be understood that a comparator is only one way of implementing an adjustment current apparatus and that there are other ways to adjust like by using additional current adjustment boards with connections made by means of copper strips and brackets attached to a selected group of LEDs.

It should be noted that the above description of the adjustment current and first current is provided merely for the purpose of illustration, and should not be designated as the only practical embodiment. Each unit above may be implemented via one or more components and the functions of each unit are not limited therein. Each unit above may be added or omitted based on particular application scenarios. Obviously, for persons having ordinary skills in the art, after understanding the general principle of current flow, without departing from the principle, may modify or change the forms and details of the particular practical ways and steps of the current flow topology that reduces heat dissipation, and further make simple deductions or substitutions, or may make modifications or combinations of the order of the units without further creative efforts. In particular, the first current is shown as a 120A in series connection topology with a 30A rating for the adjustment sources. It should be clear that these current levels are just examples. In other practical applications in the printing arts these could also be half (75A, 60A, 15A) or double (300A, 240A 60A) or anything else.

Figure 6:
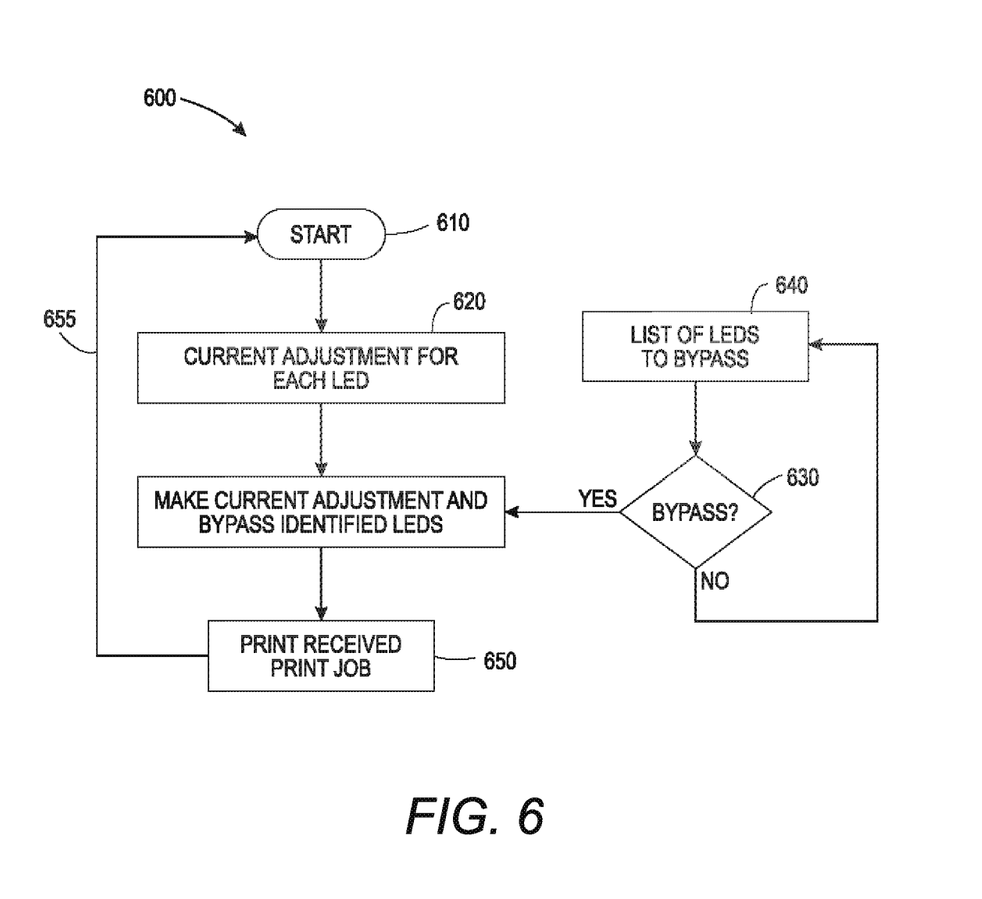
FIG. 6 is a flowchart depicting the operation of an exemplary method to directly control a driving circuit for a multi beam laser imaging module in a variable data lithographic system in accordance to an embodiment.

FIG. 6 is a flowchart depicting the operation of an exemplary method 600 to directly control a driving circuit for a multi beam laser imaging module in a variable data lithographic system in accordance to an embodiment.

Method 600 begins with action 610 where events such as system initialization or like the pressing of the start button at the variable data lithographic system such as digital image forming device 10.

Control is passed to action 620 where current adjustment for each LED is determined and/or set to a desired current level. For example, if it is determined that a certain LED would require an adjustment to the first current 315 then the adjustment current apparatus 350 is set to always maintain the current driving the LED at the required level. In parallel with action 620, action 625 receives or generates a list of LEDs that are going to be bypassed during the activation phase of LIM 36. In action 630, a determination is made if LEDs are to be bypassed. If NO, then action is returned action 625 to await instruction. If YES, then control is passed to action 640 for further processing. In action 640 the LEDs to be bypassed and the LEDs that are to be current adjusted are position for their respective status. Control is then passed to action 650 where a received print job is completed with the current adjustments and the bypassed LEDs. The key advantages of a print job processed using a serially connected array of LEDs that can be individually adjusted with current and/or bypassed is an overall system that uses less copper wires between power supply and laser device leading to reduced power loss, increased reliability, lower energy consumption, and with less cooling being required.

Those skilled in the art will appreciate that other embodiments of the disclosed subject matter may be practiced with many types of image forming elements common to offset inking system in many different configurations. For example, although digital lithographic systems and methods are shown in the discussed embodiments, the examples may apply to analog image forming systems and methods, including analog offset inking systems and methods. It should be understood that these are non-limiting examples of the variations that may be undertaken according to the disclosed schemes. In other words, no particular limiting configuration is to be implied from the above description and the accompanying drawings.

It will be appreciated that various of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art.

What is claimed is:

1. A driving circuit to drive a multi beam laser imaging module in a variable data lithographic system comprising:
   a laser imaging module comprising a series-connected laser-diode array having a plurality of laser-diodes connected in series, wherein each laser-diode has a first terminal and a second terminal, and is connected in series to an adjacent one of the laser diodes;
   a first current source to drive the laser imaging module with a first current that flows sequentially in series through each of the series-connected laser-diodes of the laser-diode array; and
   a plurality of adjustment current apparatuses, each adjustment current apparatus coupled to a respective one of the laser-diodes for producing a respective adjustment current to the first current flowing into the first terminal of the respective laser-diode in accordance to a reference level;
   wherein each adjustment current apparatus is connected in series to an adjacent adjustment current apparatus and is parallel connected to its respective laser-diode to supply the respective adjustment current.

2. The driving circuit in accordance to claim 1, wherein each of the adjustment current apparatuses comprises a comparator configured to compare the first current to a reference current.

3. The driving circuit in accordance to claim 2, wherein each of the adjustment current apparatuses shifts the first current by an amount proportional to the comparison of the first current and the reference current.

4. The driving circuit in accordance to claim 1, wherein each of the adjustment current apparatuses further comprises an electronically switchable circuit that selectively connects the first and the second terminal of the respective laser-diode.

5. The driving circuit in accordance to claim 4, wherein each of the electronically switchable circuits is configured to prevent activation of the respective laser-diode.

6. The driving circuit in accordance to claim 5, wherein each of the electronically switchable circuits is configured to short-circuit the first and second terminal of the respective laser-diode to prevent activation thereof.

7. The driving circuit in accordance to claim 6, wherein each of the electronically switchable circuits includes an N channel MOSFET alternately turning substantially on and substantially off and coupled to provide a switched current path to the first current.

8. The driving circuit in accordance to claim 7, wherein each of the N channel MOSFETs is controlled by a triggering signal.

9. The driving circuit in accordance to claim 1, further comprising:
an electric gate at each of the laser-diodes connected in series to cause an opening event to occur allowing the first current to bypass the respective laser diode;
wherein the electric gate prevents the activation of a respective laser-diode.

10. The driving circuit in accordance to claim 1, wherein the adjustment current apparatus includes an electronically switchable circuit that selectively connects the first and the second terminal of a selected one of the laser-diodes.

11. A method for controlling a driving circuit to drive a multi beam laser imaging module in a variable data lithographic system comprising:
providing a laser imaging module comprising a series-connected laser-diode array having a plurality of laser-diodes connected in series, wherein each laser-diode has a first terminal and a second terminal, and is connected in series to an adjacent one of the laser diodes;
providing a first current source to drive the laser imaging module with a first current that flows sequentially in series through each of the series-connected laser-diodes of the laser-diode array; and
providing a plurality of adjustment current apparatuses, each adjustment current apparatus coupled to a respective one of the laser-diodes for producing a respective adjustment current to the first current flowing into the first terminal of the respective laser-diode in accordance to a reference level;
wherein adjustment current apparatus is adjustment current apparatus and is parallel connected to its respective laser-diode to supply the respective adjustment current.

12. The method in accordance to claim 11, wherein each of the adjustment current apparatuses uses a comparator configured to compare the first current to a reference current.

13. The method in accordance to claim 12, wherein each of the adjustment current apparatuses shifts the first current by an amount proportional to the comparison of the first current and the reference current.

14. The method in accordance to claim 11, wherein each of the adjustment current apparatuses uses an electronically switchable circuit that selectively connects the first and the second terminal of the respective laser-diode.

15. The method in accordance to claim 14, wherein each of the electronically switchable circuits is configured to prevent activation of the respective laser-diode.

16. The method in accordance to claim 15, wherein each of the electronically switchable circuits is configured to short-circuit the first and second terminal of the respective laser-diode to prevent activation thereof.

17. The method in accordance to claim 16, wherein each of the electronically switchable circuits includes an N channel MOSFET alternately turning substantially on and substantially off and coupled to provide a switched current path to the first current.

18. The method in accordance to claim 17, wherein each of the N channel MOSFETs is controlled by a triggering signal.

19. The method in accordance to claim 11, the method further comprising:
providing an electric gate at each of the laser-diodes connected in series to cause an opening event to occur allowing the first current to bypass the laser diode;
wherein the electric gate prevents the activation of the respective laser-diode.

20. A driving circuit to drive a multi beam laser imaging module in a variable data lithographic system comprising:
a laser imaging module comprising a series-connected laser-diode array having a plurality of laser-diodes connected in series, wherein each laser-diode has a first terminal and a second terminal, and is connected in series to an adjacent one of the laser diodes;
a first current source to drive the laser imaging module with a first current that flows sequentially in series through each of the series-connected laser-diodes of the laser-diode array; and
an adjustment current apparatus coupled to the series-connected laser-diode array for producing an adjustment current to the first current flowing into the first terminal of the laser-diodes connected in series in accordance to a reference level;
wherein the adjustment current apparatus is parallel connected to a laser-diode to supply the adjustment current.

* * * * *